(12) United States Patent
Baba

(10) Patent No.: US 7,288,722 B2
(45) Date of Patent: Oct. 30, 2007

(54) PACKAGING STRUCTURE AND PACKAGING METHOD OF ELECTRONIC COMPONENTS

(75) Inventor: Shunji Baba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1 day.

(21) Appl. No.: 11/049,901

(22) Filed: Feb. 4, 2005

(65) Prior Publication Data

US 2005/0133250 A1  Jun. 23, 2005

Related U.S. Application Data

(63) Continuation of application No. PCT/JP02/12863, filed on Dec. 9, 2002.

(51) Int. Cl.
| | |
|---|---|
| H05K 1/00 | (2006.01) |
| H05K 3/30 | (2006.01) |
| H01R 12/04 | (2006.01) |
| H05K 1/11 | (2006.01) |

(52) U.S. Cl. .................. 174/254; 174/255; 174/262; 361/749; 29/835

(58) Field of Classification Search ............... 174/254, 174/255, 262–266; 361/749–751; 29/832, 29/834, 835
See application file for complete search history.

(56) References Cited

U.S. PATENT DOCUMENTS

| | | | | |
|---|---|---|---|---|
| 5,224,023 | A * | 6/1993 | Smith et al. ................ | 361/784 |
| 5,363,275 | A * | 11/1994 | Frankeny et al. ........... | 361/749 |
| 5,742,480 | A * | 4/1998 | Sawada et al. ............. | 361/749 |
| 6,208,521 | B1 * | 3/2001 | Nakatsuka ................... | 361/749 |
| 6,908,792 | B2 * | 6/2005 | Bruce et al. ................ | 438/110 |

FOREIGN PATENT DOCUMENTS

| | | |
|---|---|---|
| JP | 5-8969 | 2/1993 |
| JP | 6-7265 | 1/1994 |
| JP | 10-326970 A | 12/1998 |
| JP | 11-17288 A | 1/1999 |
| JP | 2001-244667 | 9/2001 |
| JP | 2001-244669 A | 9/2001 |
| JP | 2001-288667 A | 9/2001 |
| JP | 2002-171069 A | 6/2002 |

* cited by examiner

*Primary Examiner*—Jeremy C. Norris
(74) *Attorney, Agent, or Firm*—Staas & Halsey LLP

(57) ABSTRACT

An electronic part mounting structure includes a printed circuit board, a plurality of electronic parts mounted on the printed circuit board, a folded portion of the printed circuit board bent and layered between the electronic parts, through holes formed in both sides of the folded portion, and a wiring connecting the electronic parts via the through holes and connecting the electronic parts to the through holes.

12 Claims, 24 Drawing Sheets

FIG. 3
(a)
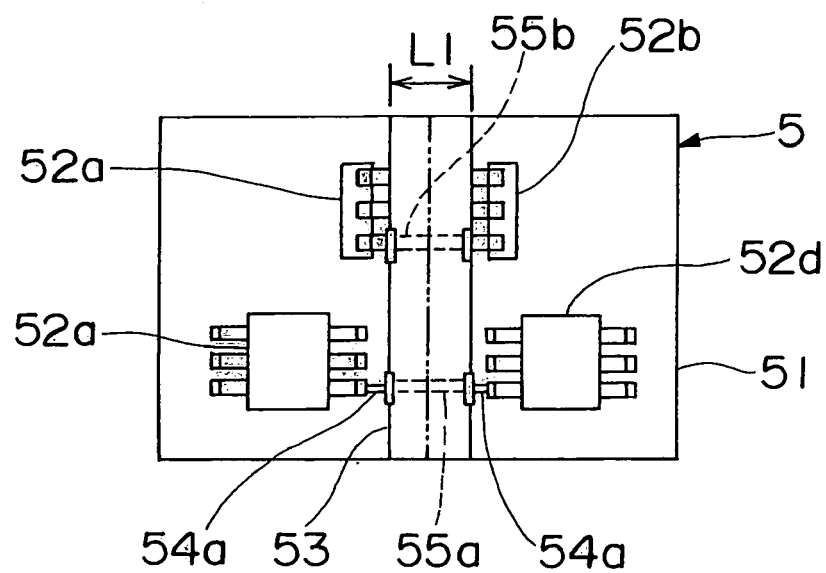
(b)
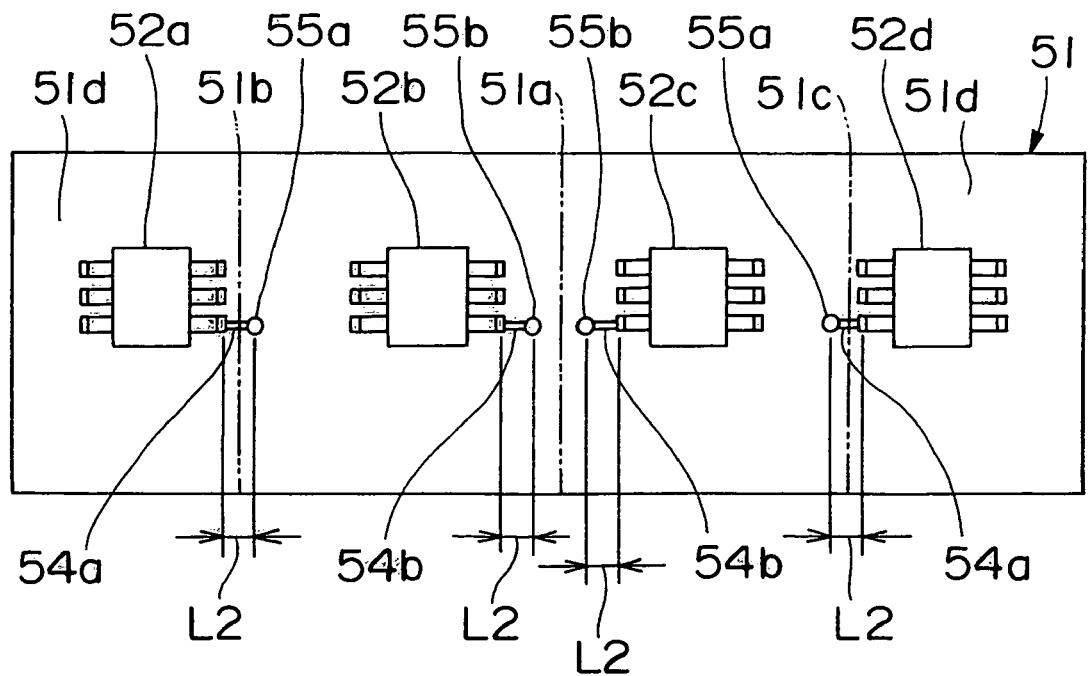

FIG. 21
(a)
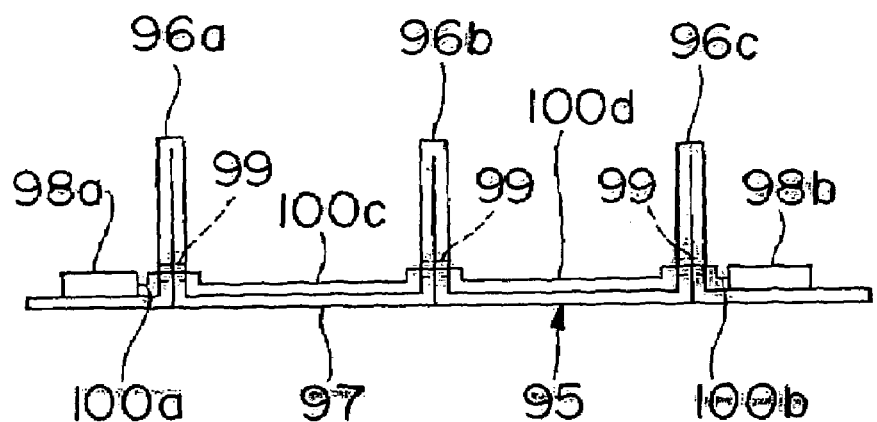
(b)
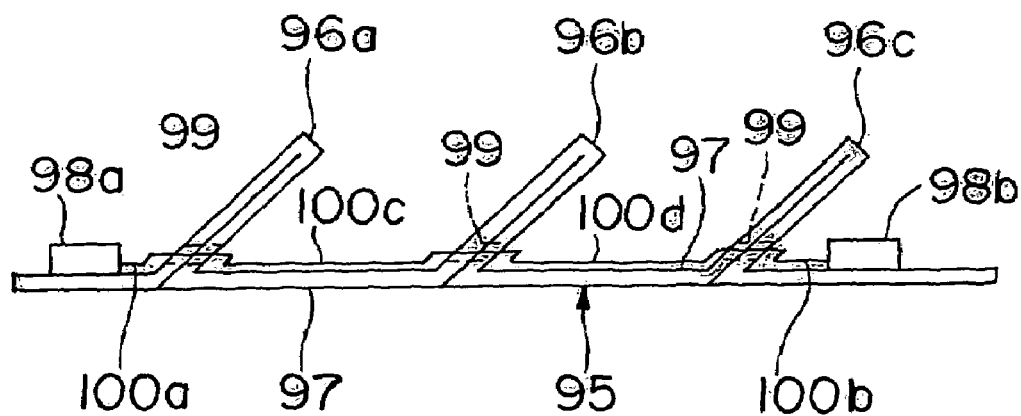

PACKAGING STRUCTURE AND PACKAGING METHOD OF ELECTRONIC COMPONENTS

CROSS REFERENCE TO RELATED APPLICATIONS

This is a continuing application, filed under 35 U.S.C. §111(a), of International Application PCT/JP02/12863, filed Dec. 9, 2002.

BACKGROUND OF INVENTION

1. Technical Field

The present invention relates to a packaging structure and a packaging method of electronic components, which are suitable for their being applied to a memory module, a driver for a liquid crystal display and so on.

2. Background Arts

A printed circuit board has hitherto been formed in a flat plate-like shape, wherein electronic components (circuit components) mounted on a surface thereof are connected by wires. FIG. 23 shows this type of conventional printed circuit board 1.

A surface of this printed circuit board 1 is mounted with a plurality of electronic components 10a–10d. Then, the electronic components 10a, 10d disposed at both ends are connected by a wire 11a, and the electronic components 10b, 10c therebetween are connected by a wire 11b.

Proposed further is a multi-layer wiring board 15 wherein, as shown in FIG. 24, an insulating layer 13 made of a flexible film is folded at a predetermined folding portion 14 and stacked (laminated) in thicknesswise direction (refer to, e.g., Patent document 1).

In this multi-layer wiring board 15, a single-layer conductive circuit layer 16 is formed on the insulating layer 13 developed before being folded, and these layers are folded, whereby the conductive circuit layer 16 can be multi-layered. Accordingly, the manufacturing process can be simplified as compared with a case of stacking the plurality of conductive circuit layers 16 one by one.

Note that in FIG. 24, the numerals 17, 18 represent conductive members inserted into holes of the insulating layer 13, the numeral 19 stands for an inter-layer insulating layer, the numeral 20 designates an electronic component, and the numeral 21 indicates a motherboard.

[Patent Document 1]
Japanese Patent Application Laid-Open Publication No.2002-171069 (FIG. 5)

In the conventional flat plate-like printed circuit board 1 (see FIG. 23), however, there arises a problem, wherein if an interval between the electronic components 10a, 10d that should be connected is large, a length L3 of the wire 11a therebetween becomes elongate.

Thus, if the length L3 of the wire 11a between the electronic components 10a, 10d is elongated, a problem such as cross-talk, a signal delay, etc might occur.

These problems occur similarly in the multi-layer wiring board 15 (see FIG. 24) formed by folding and stacking the layers. Namely, in this multi-layer wiring board 15, when connecting the electronic components 20 disposed on both surfaces thereof to the motherboard 21, the wires (unillustrated) therebetween are formed in a state of developing the conductive circuit layer 16. Therefore, in the developed state of the conductive circuit layer 16, if there is a large interval between the conductive member 17 on the side of the electronic component and the conductive member 18 on the side of the motherboard 21, a length of the wire making a connection therebetween also gets elongate.

SUMMARY OF THE INVENTION

It is an object of the present invention, which was devised in view of those problems, to provide a packaging structure and a packaging method of electronic components that are capable of reducing a length of a wire for connecting the electronic components.

The present invention adopts the following means in order to solve the problems described above. Namely, the present invention is a packaging structure of electronic components, comprising a printed circuit board, a plurality of electronic components mounted on the printed circuit board, a folded portion formed by folding and stacking the printed circuit board between the electronic components, through-holes formed in both surfaces of the folded portion, and wires provided between the electronic components and the through-holes, and thus connecting the electronic components via the through-holes.

It is preferable that the printed circuit board involves using an easy-to-fold flexible board.

According to the present invention, the electronic components mounted on the both surface of the folded portion are connected by the wires extending via the through-holes formed in the folded portion, and hence the length of the wire becomes shorter than in a case of connecting the electronic components on the same flat plate-like printed circuit board as the folded portion is developed.

Herein, the wires can connect the electronic components mounted on other than the folded portion of the printed circuit board to the through-holes in the folded portion. Further, the folded portion can be substantially orthogonal to a surface mounted with the electronic component.

Moreover, the folded portion can be mounted with the electronic components that should be connected.

Still further, the stacked printed circuit boards stacked at the folded portion can be fixed to each other. In this case, a gap is prevented from being formed between the stacked printed circuit boards, and it is therefore possible to prevent the wire from being cut off, thereby improving the reliability.

Moreover, land portions can be formed on both end surfaces of the through hole. In this case, the wire and the through-hole can be surely connected.

Moreover, two or more pieces of folded portions can be formed. Herein, the two or more pieces of folded portions can be arranged side by side. Yet further, the two or more pieces of folded portions can be arranged in a radial configuration.

Furthermore, three pieces of folded portions are formed, and the folded portions and a portion formed by stacking both edge portions of the printed circuit board can configure a cross shape. Thus, the plurality of folded portions are provided, thereby making it possible to reduce the lengths of the wires for connecting the multiplicity of electronic components mounted on the printed circuit board.

Note that the respective device components can be combined with each other unless deviating from the gist of the present invention. Further, the present invention is a packaging method of electronic components, comprising forming patterns of wires on a printed circuit board, forming a folded portion by folding and stacking the printed circuit board at a discontinuous portion of the patterns, forming a through-hole, in the folded portion, for connecting the patterns formed on both surfaces of the folded portion, forming the wires by covering the patterns and an inner face of the through-hole with a conductive substance, and mounting the electronic components on the printed circuit board and connecting the electronic components to the wires.

Note that the respective steps can be combined with each other unless deviating from the gist of the present invention.

BRIEF DESCRIPTION OF THE DRAWINGS

FIG. 3(a) is a top view showing the first embodiment of the present invention; FIG. 3(b) is a top view showing a state where a folded portion in the first embodiment of the present invention is developed;

FIG. 21(a) is a front view showing a state where a folded portion in the sixth embodiment of the present invention is erected; FIG. 21(b) is a front view showing a state where the folded portion is tilted;

DETAILED DESCRIPTION OF THE INVENTION

A best mode of the present invention will hereinafter be described with reference to the drawings.

First Embodiment

Figure 1:
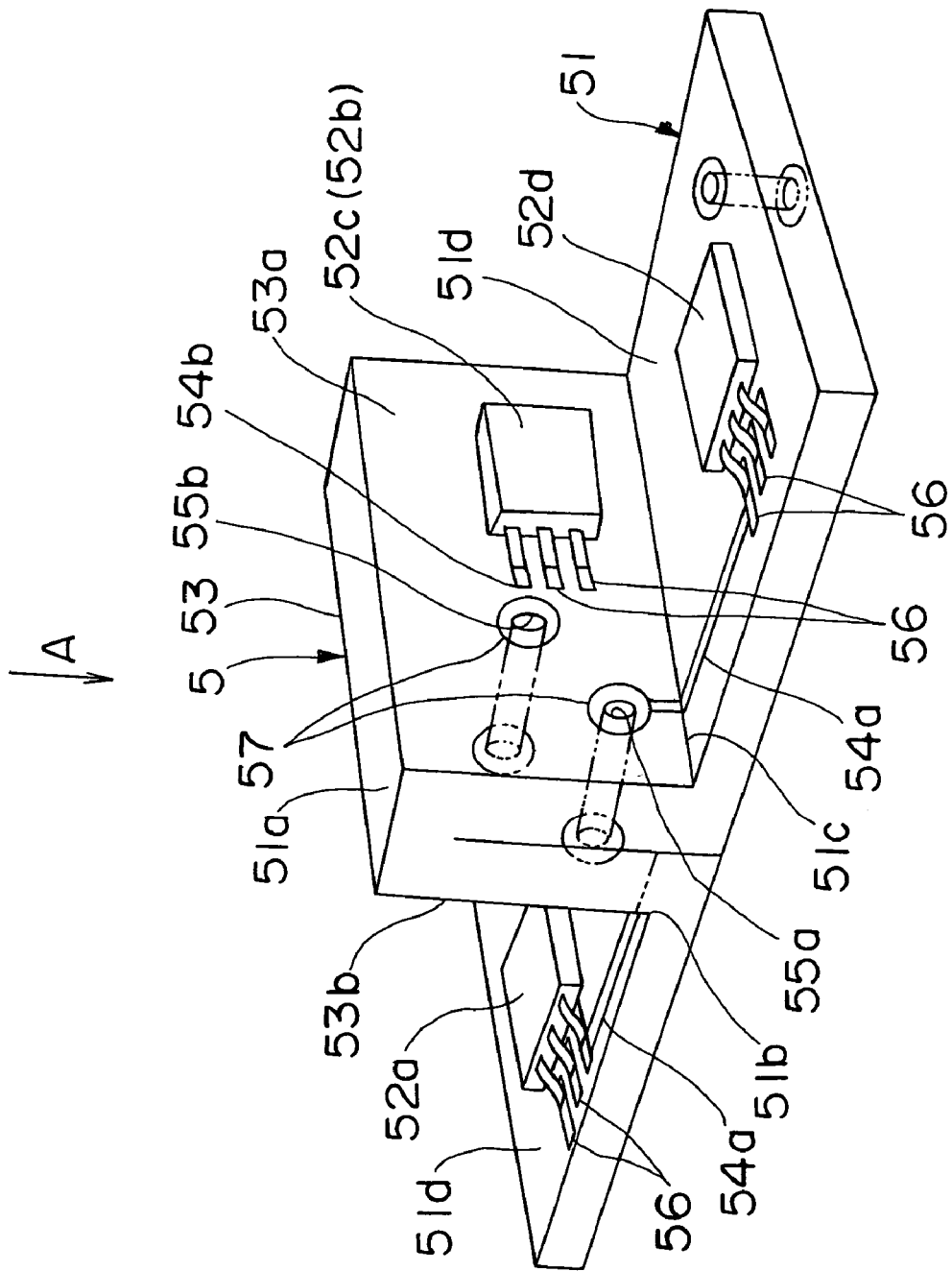
FIG. 1 is a perspective view showing a first embodiment of the present invention.

FIG. 1 shows a memory module 5 in a first embodiment to which the present invention is applied. This memory module 5 includes a printed circuit board 51, a plurality of electronic components 52a–52d (see FIG. 2) mounted on this printed circuit board 51, and a folded portion 53 of the printed circuit board 51, at which the printed circuit board 51 is folded and stacked (laminated) between electronic components. In this example, the folded portion 53 is a double-stacked portion.

Further, this memory module 5 includes printed through-holes 55a, 55b formed in both of surfaces of the folded portion 53, and wires 54a, 54b establishing connections between the electronic components 52a–52d via the through-holes 55a, 55b and provided between the electronic components 52a–52d and the through-holes 55a, 55b.

Next, the respective device components will be explained. It is preferable that the printed circuit board 51 involves using an easy-to-fold flexible board. A variety of electronic components can be used as the electronic components 52a–52d according to the necessity.

Herein, the lead-attached electronic components 52a–52d are employed. Formed in predetermined positions on the printed circuit board 51 are terminals 56 for connecting the wires 54a, 54b to the leads of the respective electronic components 52a–52d. The electronic components 52a–52d are mounted in the vicinity of these terminals 56.

Among these electronic components 52a–52d, the electronic components 52a, 52d disposed at both side ends and exhibiting a larger interval therebetween are connected by the wire 54a. Further, the electronic components 52b, 52c exhibiting a smaller interval therebetween are connected by the wire 54b.

The folded portion 53 is formed by folding the printed circuit board 51 between the connected electronic components 52a and 52d and stacking the folded printed circuit board 51 between the connected electronic components 52b and 52c.

The wires 54a, 54a connecting the electronic components 52a, 52d mounted outside the folded portion 53 and exhibiting the larger interval, extend from the electronic components 52a, 52d up to the both surfaces of the folded portion 53. The wires 54a, 54a connecting the electronic components 52b, 52c mounted on the folded portion 53 and exhibiting the smaller interval, are respectively formed on only the surfaces of the folded portion 53.

The folded portion 53 is folded in a ridged shape at an angle of 180° substantially at a central portion 51a between the connected electronic components 52a and 52d; and 52b and 52c.

Moreover, portions 51b, 51c apart on both sides from substantially at an equal distance substantially from the folded central portion 51a, are bent in a trough shape at an angle of approximately 90°.

With this configuration, the folded portion 53 is formed protruding so as to be substantially orthogonal to flat surfaces 51d mounted with the electronic components 52a, 52d exhibiting the larger interval. The printed circuit boards 51, 51 configuring this folded portion 53 are fixed to each other by, e.g., a bonding agent and so on.

Figure 2:
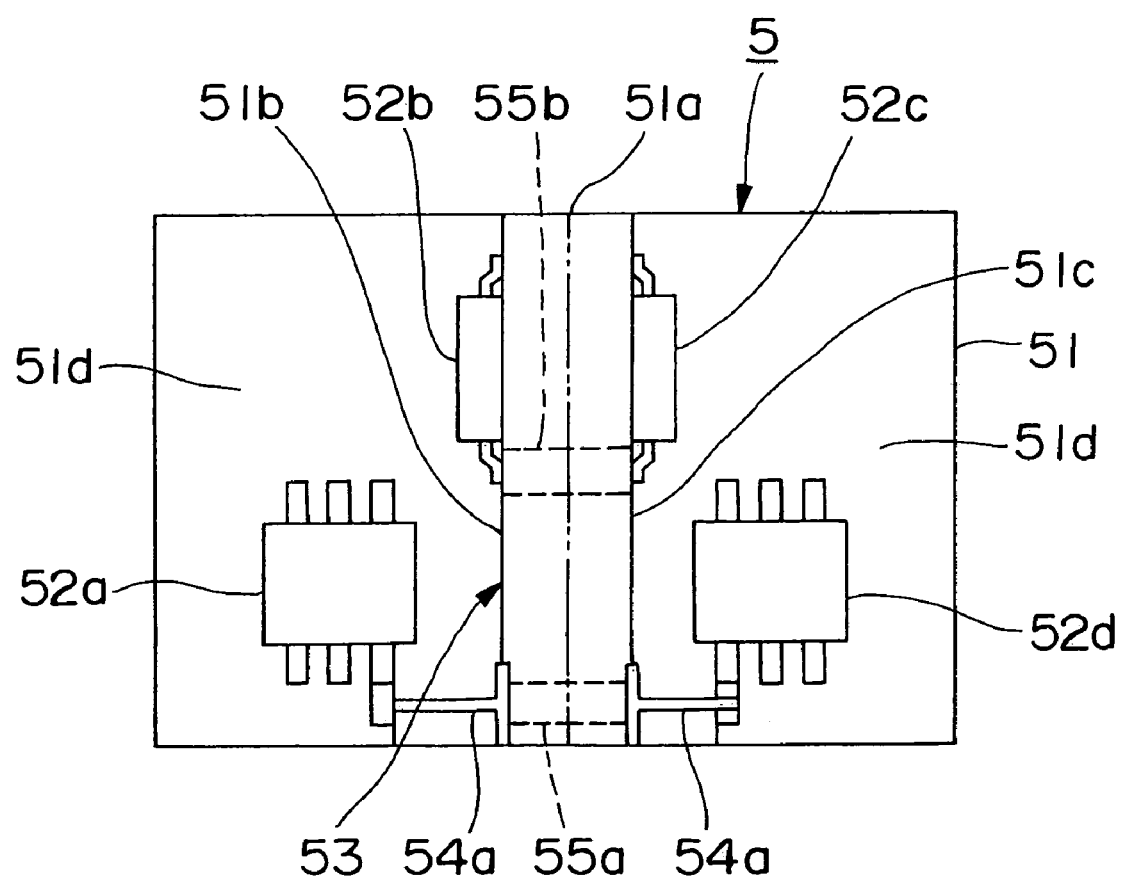
FIG. 2 is an arrow view taken along the arrow line A in FIG. 1.

Further, as shown in FIG. 2, the electronic components 52b, 52c having the smaller interval are mounted substantially in symmetrical positions on the both surfaces of the folded portion 53.

Positions of the through-holes 55a, 55b in FIG. 1 are set so that lengths of the wires 54a, 54b become short to the greatest possible degree.

To be specific, the through-hole 55a for connecting the electronic components 52a, 52d mounted on the flat surface 51d outside the folded portion 53 of the printed circuit board 51, is formed in positions that are as close to the proximal portions 51b, 51c of the folded portion 53 as possible.

Moreover, the through-hole 55b for connecting the electronic components 52b, 52c mounted on the folded portion 53, is formed in positions that are as close to the electronic components 52b, 52c as possible. Note that land portions 57 are formed at both side ends of the through-holes 55a, 55b.

Next, an effect of this memory module 5 will be explained. FIG. 3(a) is a top view of the memory module 5. FIG. 3(b) is a top view showing the folded portion 53, in a unfolded state, of the memory module 5.

Note that FIG. 3(b) shows, for simplifying the explanation, a state in which the electronic components 52a, 52d exhibiting the larger interval and the electronic components 52b, 52c exhibiting the smaller interval, are arranged in one row.

Herein, as shown in FIG. 3(a), let L1 be thickness of the folded portion 53. Further, as shown in FIG. 3(b), intervals between the electronic components 52a–52d and the through-holes 55a, 55b are set to the same dimension L2.

As illustrated in FIG. 3(b), an entire length La of the wire 54a connecting the electronic components 52a, 52d having the larger interval that are mounted on the flat surface 51d of the printed circuit board 51, is given by La=L2+L2+L1 in the folded state. Moreover, an entire length Lb of the wire 54b connecting the electronic components 52b, 52c having the smaller interval that are mounted on the folded portion 53, is given by Lb=L2+L2+L1 in the folded state. Namely, La is equal to Lb (La=Lb) in the folded state.

As described above, in the memory module 5 of the present invention, the electronic components 52a–52d mounted on the same surfaces can be, even if different in their intervals, in the developed state (see FIG. 3(b)) of the printed circuit board 51, connected by the wires 54a, 54b having the same length (La=Lb).

Figure 23:
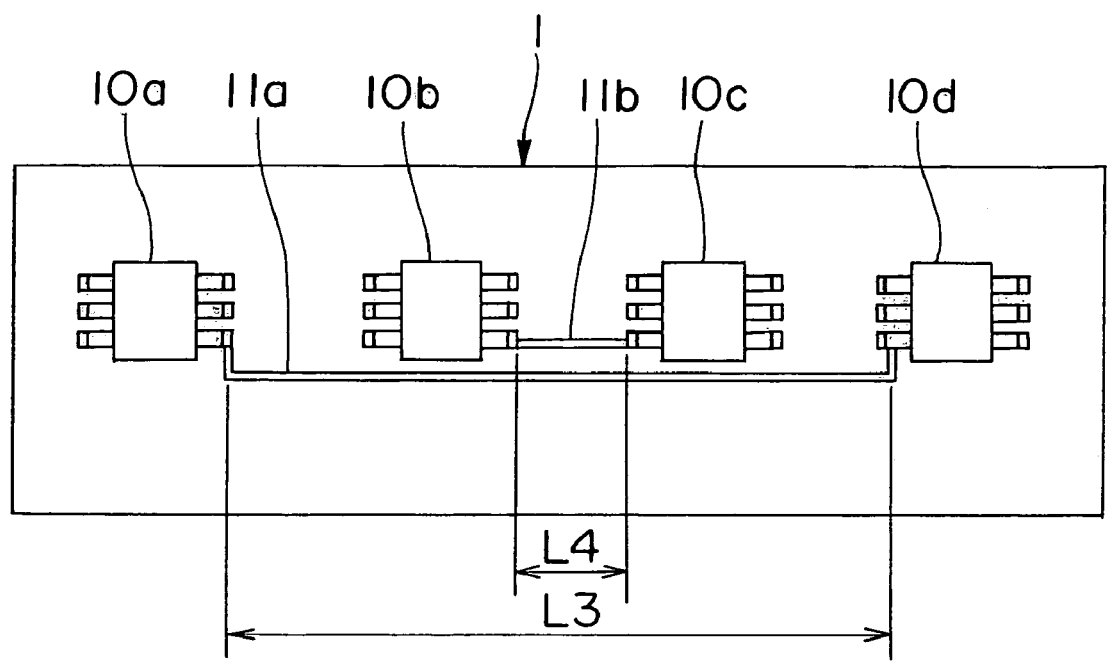
FIG. 23 is a perspective view showing a prior art.
Figure 24:
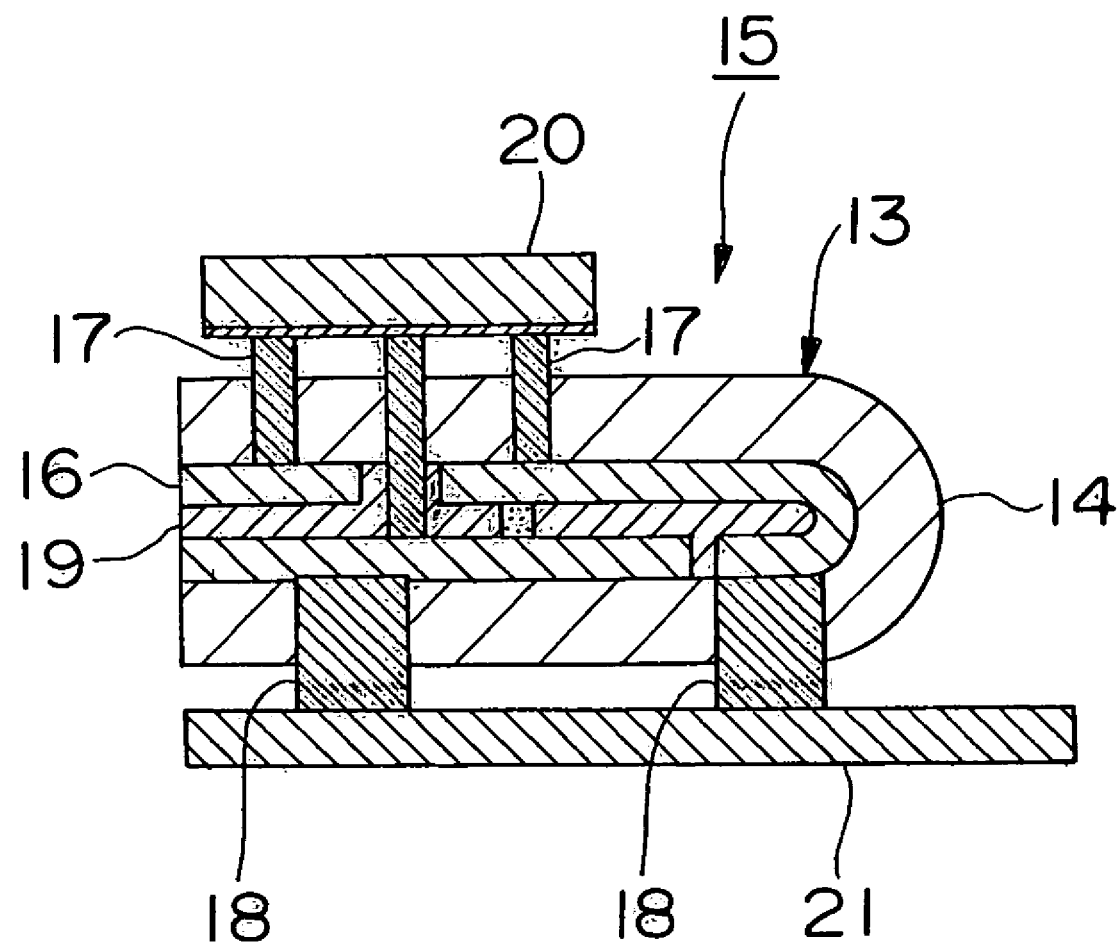
FIG. 24 is a sectional view showing another prior art.

Further, the lengths La, Lb of the wires 54a, 54b are shorter by a dimension between the through-holes 55a and 55a or 55b and 55b than the lengths L3, L4 (see FIG. 23) of the wires 11a, 11b on the conventional printed circuit board 1 formed in the flat plate shape.

Accordingly, even when there is a large interval between the electronic components 52a, 52d that should be connected, the wire 54a therebetween can be considerably shortened, and hence it is possible to restrain occurrences of cross-talk, a signal delay and so on.

Second Embodiment

Figure 4:
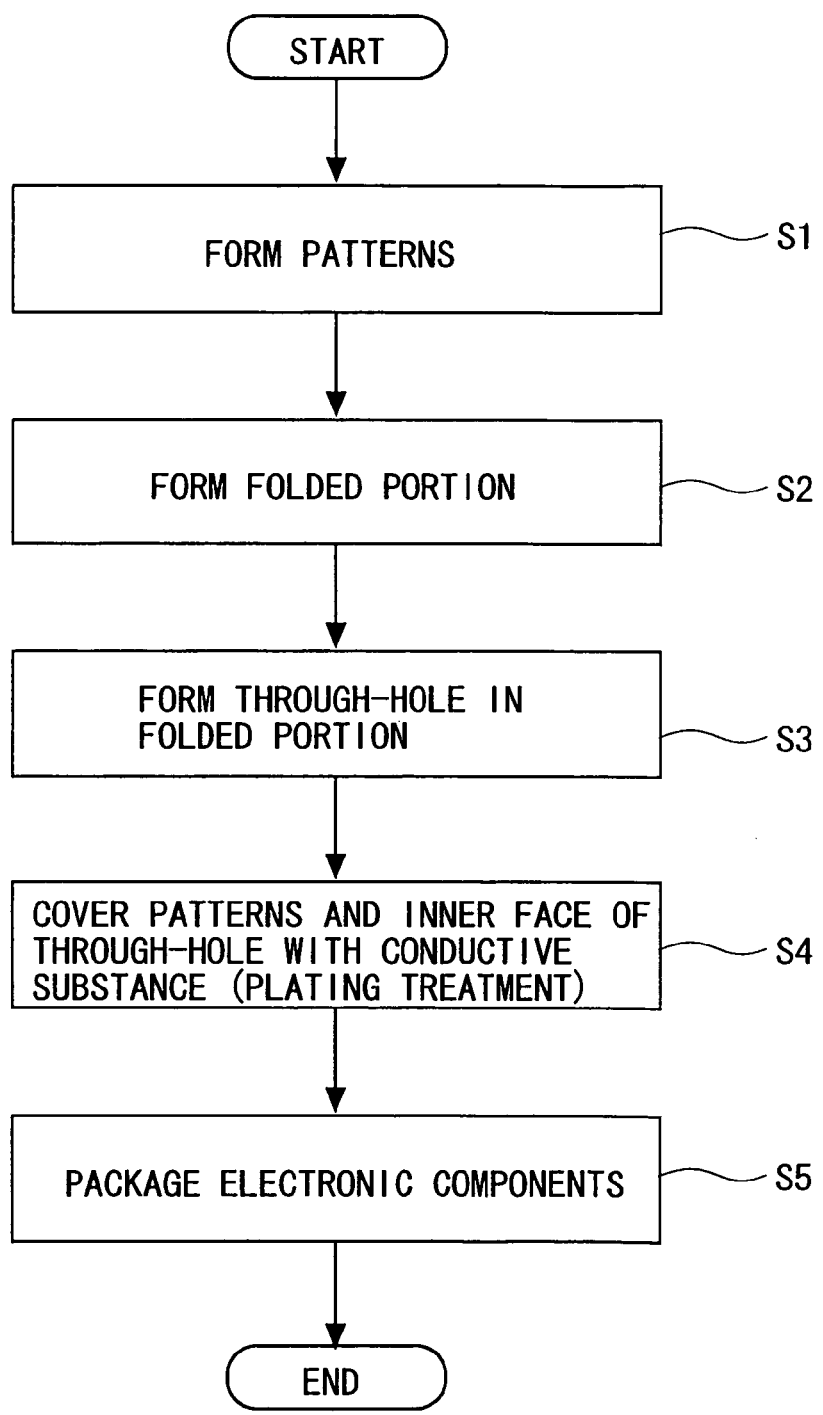
FIG. 4 is a flowchart showing a second embodiment of the present invention.

Next, a method of manufacturing the memory module 5 will be described. FIG. 4 is a flowchart showing manufacturing steps of the memory module 5.

Herein, as shown in FIG. 4, to start with, patterns of the wires 54a, 54b and the land portions 57 are formed on the printed circuit board 5 (step 1).

Next, the folded portion 53 is formed by folding the printed circuit board 51 (step 2). Next, the through-holes are formed in the folded portion 53 by using a drill (step 3).

Subsequently, the patterns of the wires 54a, 54b, inner faces of the through-holes and the land portions 57 are covered with a conductive substance such as copper. The wires 54a, 54b, the through-holes 55a, 55b and the land portions 57 are thereby formed (step 4). Note that the covering of the conductive substance can be conducted by a plating treatment, etc.

Next, the electronic components 52a–52d are mounted in the predetermined positions on the printed circuit board 51 (step 5). This is an end of the manufacturing processes of the memory module 5.

Figure 5:
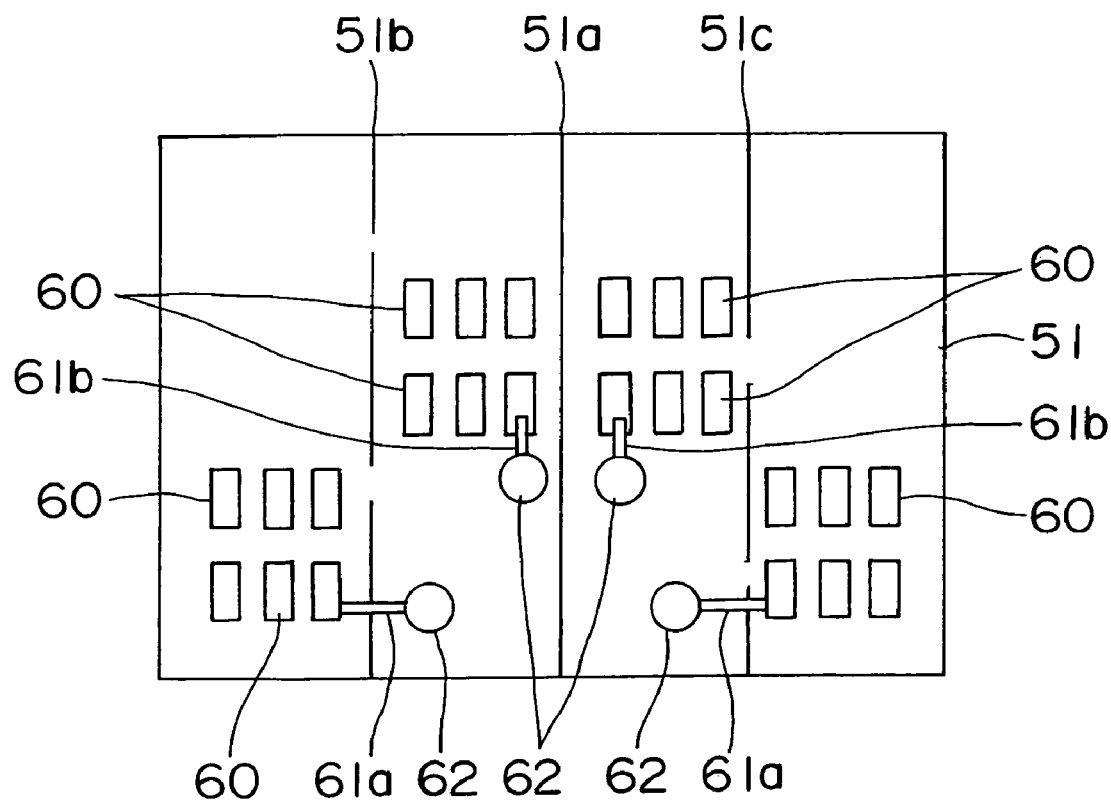
FIG. 5 is an explanatory top view showing the second embodiment of the present invention.

Next, the respective processes in steps 1 through 5 will be explained. In the pattern forming process in step 1, as shown in FIG. 5, a pattern 60 of the terminal 56 (see FIG. 1), patterns 61a, 61b of the wires 54a, 54b and a pattern 62 of the land portion 57 are formed in the same process as on the normal printed wiring board.

Figure 6:
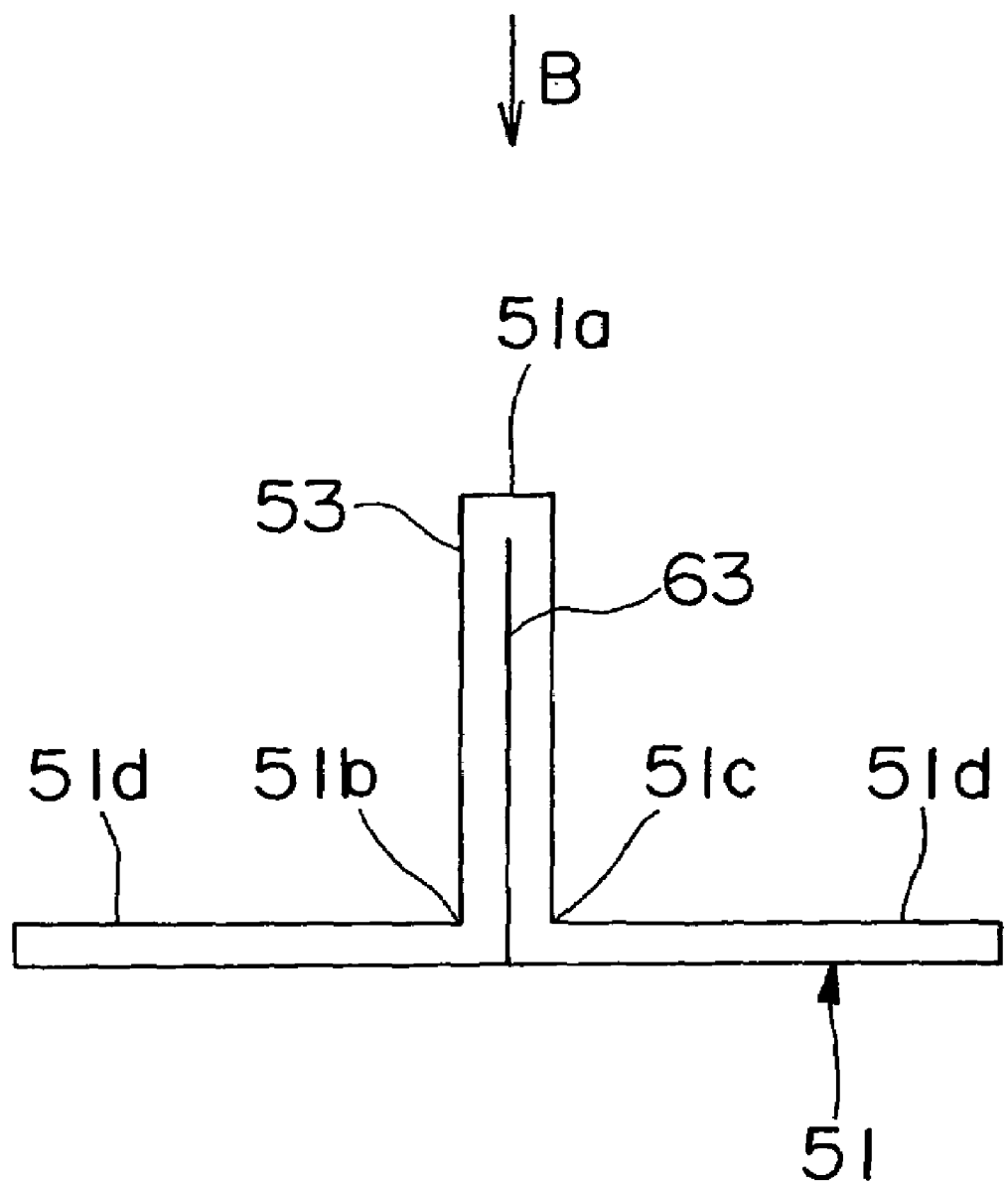
FIG. 6 is an explanatory front view showing the second embodiment of the present invention.

In the process of forming the folded portion 53 in step 2, as shown in FIG. 6, substantially the central portion 51a of the printed circuit board 51 is folded in the ridged shape at the angle of 180°. Further, the portions 51b, 51c apart on both sides at the equal distance substantially from the central portion 51a are bent in the trough shape at the angle of approximately 90°.

With this configuration, the folded portion 53 is formed protruding so as to be substantially right-angled to the flat surfaces 51d of the printed circuit board 51. Herein, the printed circuit boards 51, 51 stacked to configure the folded portion 53 are fixed to each other by, e.g., a bonding agent 63, and so on.

Figure 7:
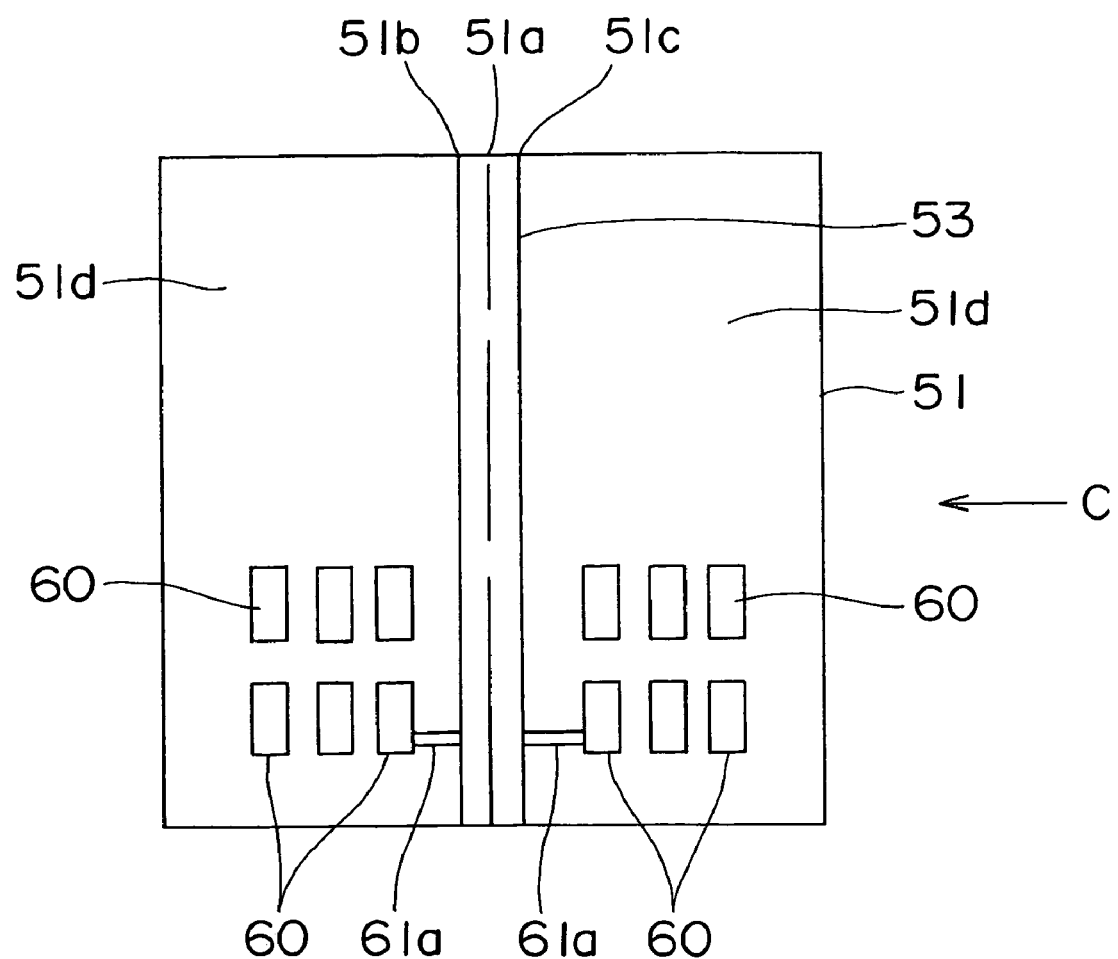
FIG. 7 is an arrow view taken along the arrow line B in FIG. 6.

With the formation of this folded portion 53, as shown in FIG. 7, a half of the patterns 60 of the terminals 56 and part of the patterns 61a of the wires 54a are arranged on the flat surface 51d of the printed circuit board 51.

Figure 8:
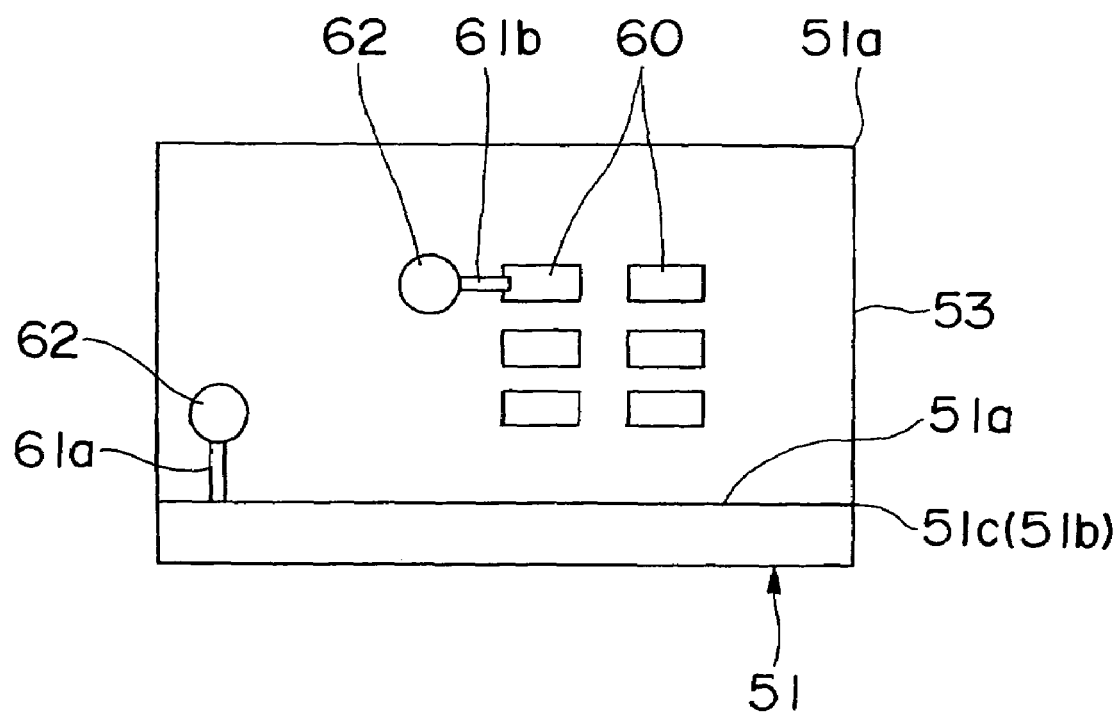
FIG. 8 is an arrow view taken along the arrow line C in FIG. 7.

A remaining half of the patterns 60 and the rest of the patterns 61a, all the patterns 61b and all the patterns 62 are, as shown in FIG. 8, respectively arranged by halves on both surfaces of the folded portion 53.

Figure 9:
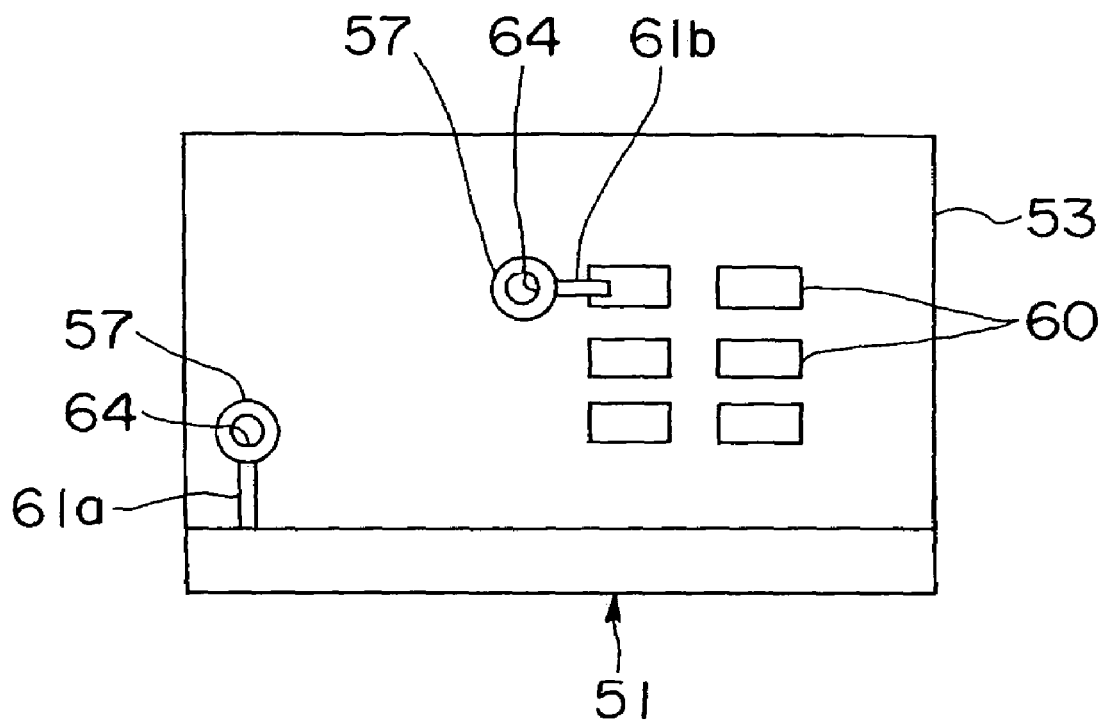
FIG. 9 is an explanatory side view showing the second embodiment of the present invention.

In the through-hole forming process in step 3, as shown in FIG. 9, a through-hole 64 of which a diameter is smaller than the pattern 62 is formed on the pattern 62 of the land portion 57 by use of the drill, etc.

In the covering process using the conductive substance in step 4, the patterns 60, 61a, 61b, 62 and an inner peripheral face of the through-hole 64 are covered with the conductive substance such as copper, etc by the plating treatment.

The wires 54a, 54b, the through-holes 55a, 55b, the terminals 56 and the land portions 57 in FIG. 1 are thereby formed.

Figure 10:
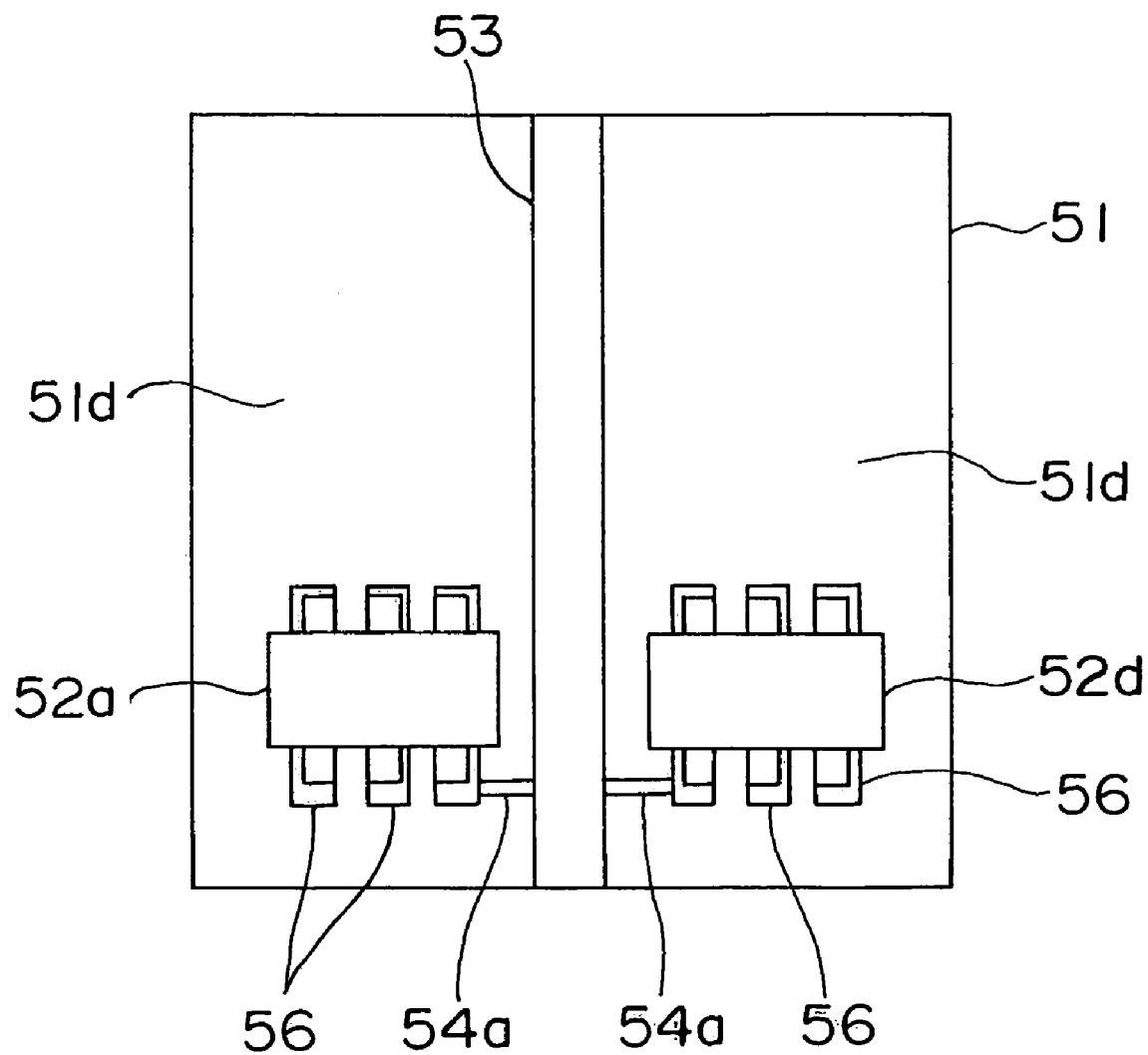
FIG. 10 is an explanatory top view showing the second embodiment of the present invention.

In the packaging process of the electronic components 52a–52d in step 5, as shown in FIG. 10, the electronic components 52a, 52d are mounted on the terminals 56 formed on the flat surfaces 51d of the printed circuit board 51 in a state of these electronic components being attached with the leads, and are fixed by soldering the leads to the terminals 56.

Figure 11:
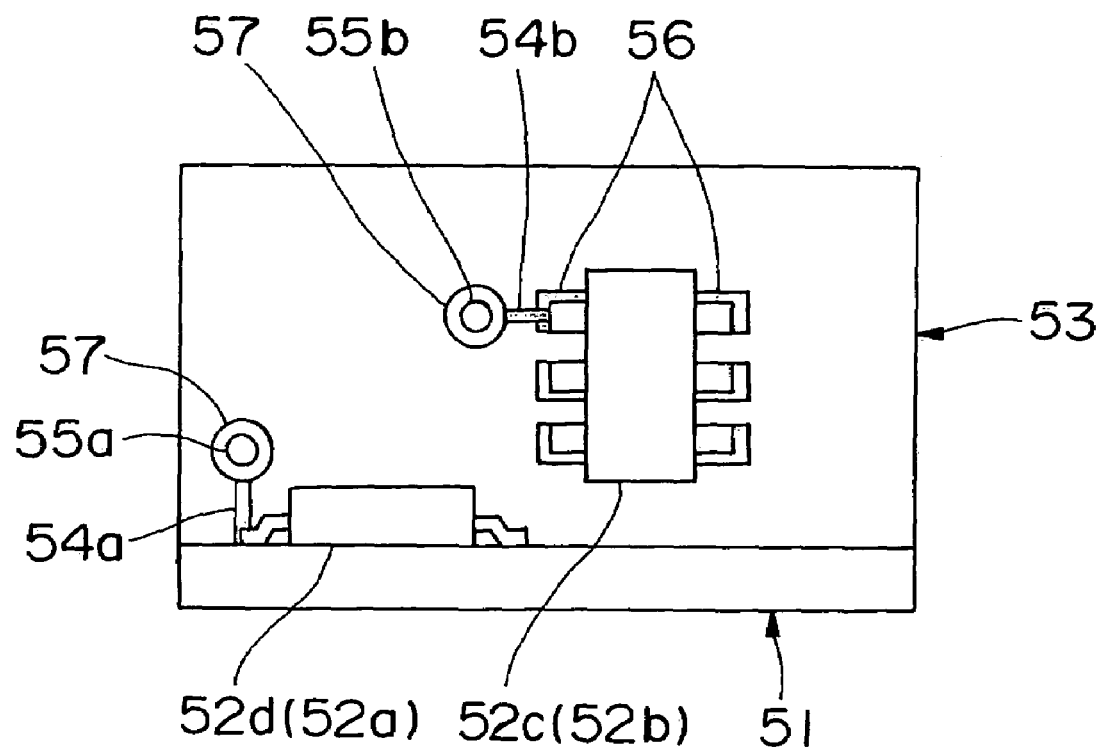
FIG. 11 is an explanatory side view showing the second embodiment of the present invention.

Further, as shown in FIG. 11, the electronic components 52b, 52c are mounted on the terminals 56 formed on the folded portion 53 of the printed circuit board 51 in a state of these electronic components being attached with the leads, and are fixed by soldering the leads to the terminals 56.

Note that in the manufacturing process described above, after forming the folded portion 53 in step 2, the through-hole 64 is formed in step 3, however, the folded portion 53 can be formed after forming the through-hole 64.

Figure 12:
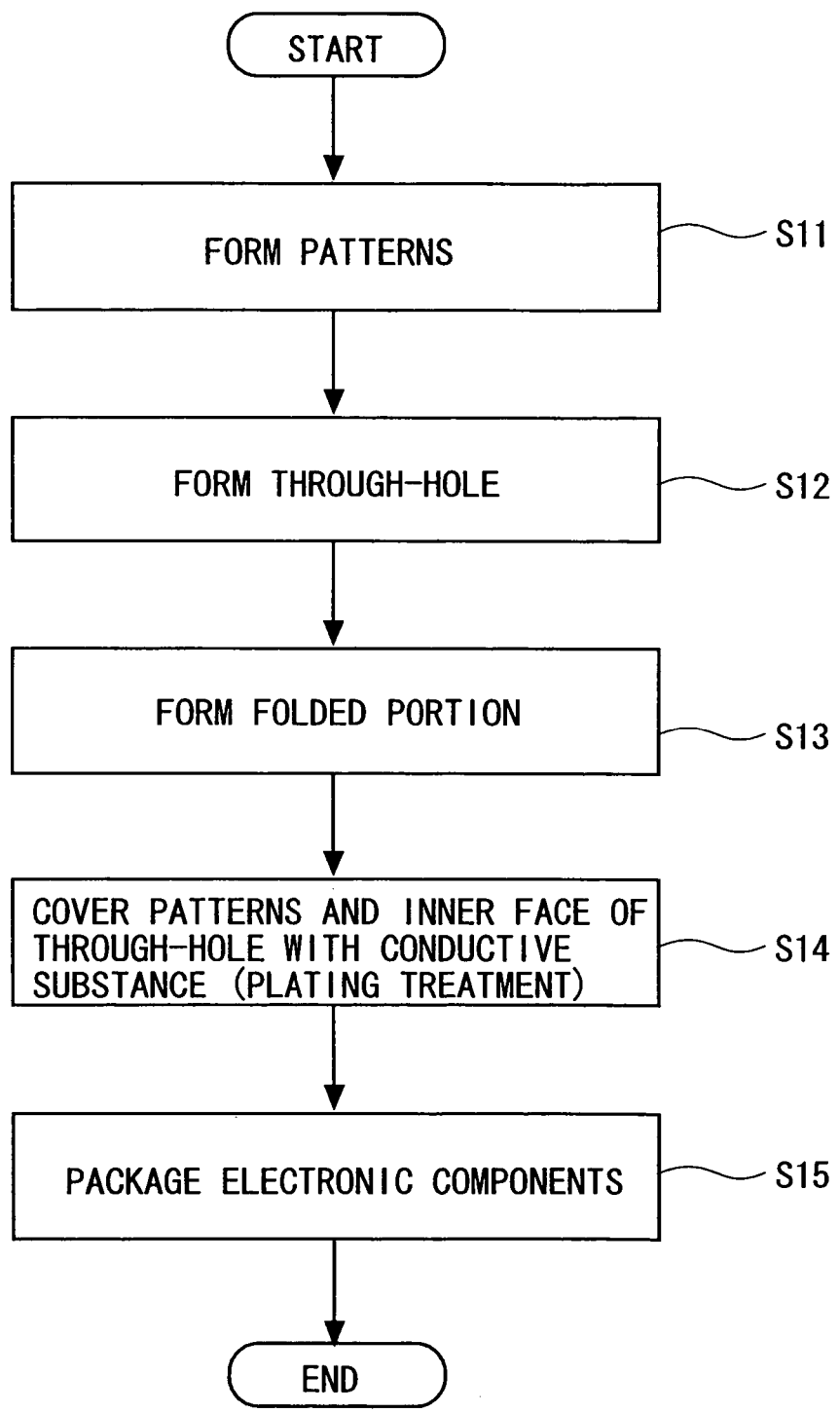
FIG. 12 is a flowchart showing another example of the second embodiment of the present invention.

In this case, as shown in FIG. 12, there are executed the formation of the patterns 60–62 (step 11), the formation of the through-hole 64 (step 12), the formation of the folded portion 53 (step 13), the covering of the conductive substance over the patterns 60–62 and the inner face of the through-hole 64 (step 14) and the mounting of the electronic components 52–52*d* (step 15) in this sequence.

Note that the respective processes described above are not limited to the sequences shown in FIG. 11 and 12 and can be combined without any restriction unless deviating from the gist of the present invention.

Third Embodiment

Figure 13:
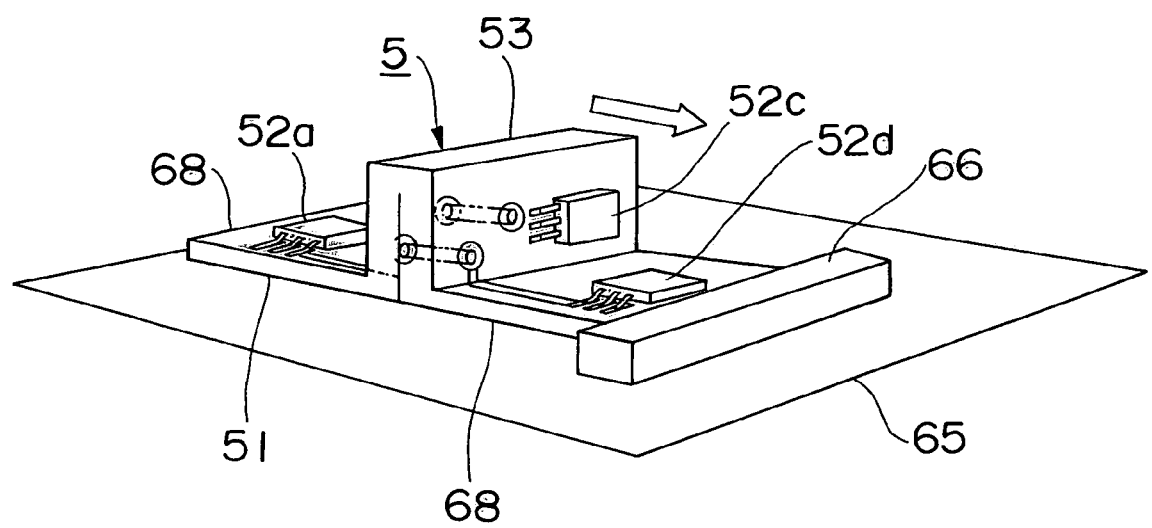
FIG. 13 is a perspective view showing a third embodiment of the present invention.
Figure 14:
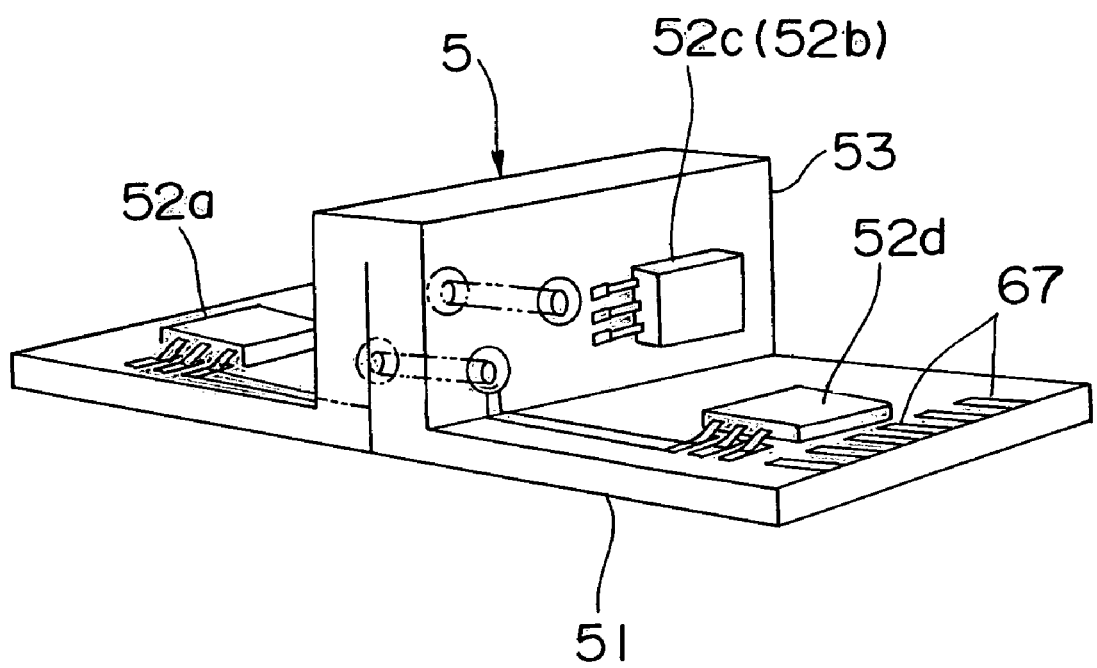
FIG. 14 is a perspective view showing the third embodiment of the present invention.

FIG. 13 shows, by way of a third embodiment of the present invention, a state wherein the memory module 5 is mounted on a motherboard 65. In this case, a connector 66 is fitted to the motherboard 65. Further, as shown in FIG. 14, an external connection terminal 67 is formed at an edge portion of the memory module 5.

Then, as shown in FIG. 13, flat portions 68, 68 of the memory module 5 are mounted on the motherboard 65 in such a state that the folded portion 53 of the memory module 5 is set upward.

In this state, the memory module 5 is slid, thus inserting its edge portion into the connector 66. The external connection terminal 67 of the memory module 5 is thereby connected to a terminal (unillustrated) of the connector 66.

Fourth Embodiment

Figure 15:
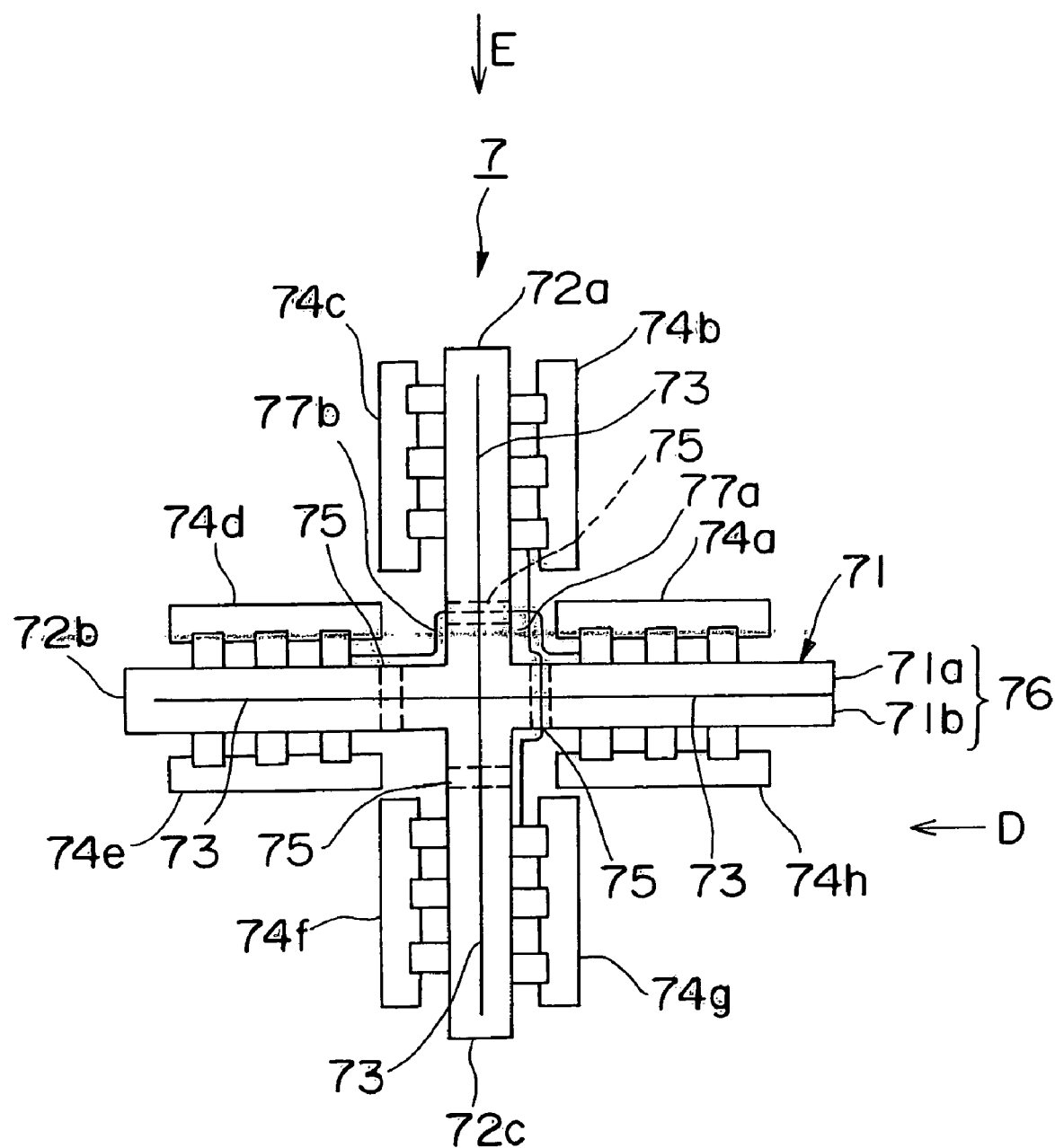
FIG. 15 is a front view showing a fourth embodiment of the present invention.

FIG. 15 shows a memory module 7 in a fourth embodiment of the present invention. This memory module 7 has three pieces of folded portions 72*a*–72*c* formed on a printed circuit board 71.

Further, bilateral edge portions 71*a*, 71*b* of the printed circuit board 71 are stacked (which will hereinafter be referred to as bilateral stacked portions 76). Then, these folded portions 72*a*–72*c* and the bilateral stacked portions 76 are formed in a cross shape in section cut by a plane orthogonal to edge lines of the folded portion and the both edge portions.

The bilateral printed circuit boards 71, 71 configuring the folded portions 72*a*–72*c* and the bilateral stacked portions 76 are fixed by a bonding agent 73.

Both surfaces of the respective folded portions 72*a*–72*c* and both surfaces of the bilateral stacked portions 76 are mounted with electronic components 74*a*–74*h*. Moreover, through-holes 75 are formed in the vicinity of base areas of the folded portions 72*a*–72*c* and of the bilateral stacked portions 76.

The electronic components 74*a*–74*h* mounted on the folded portions 72*a*–72*c* and on the bilateral stacked portions 76 are connected to the electronic components 74*a*–74*h* mounted on the folded portions 72*a*–72*c* or on the bilateral stacked portions 76 on the opposite side.

To be specific, for example, the electronic component 74*b* mounted on the right surface of the upper folded portion 72*a* in FIG. 15 is connected to the electronic component 74*g* mounted on the right surface of the folded portion 72*c* on the opposite side.

Figure 16:
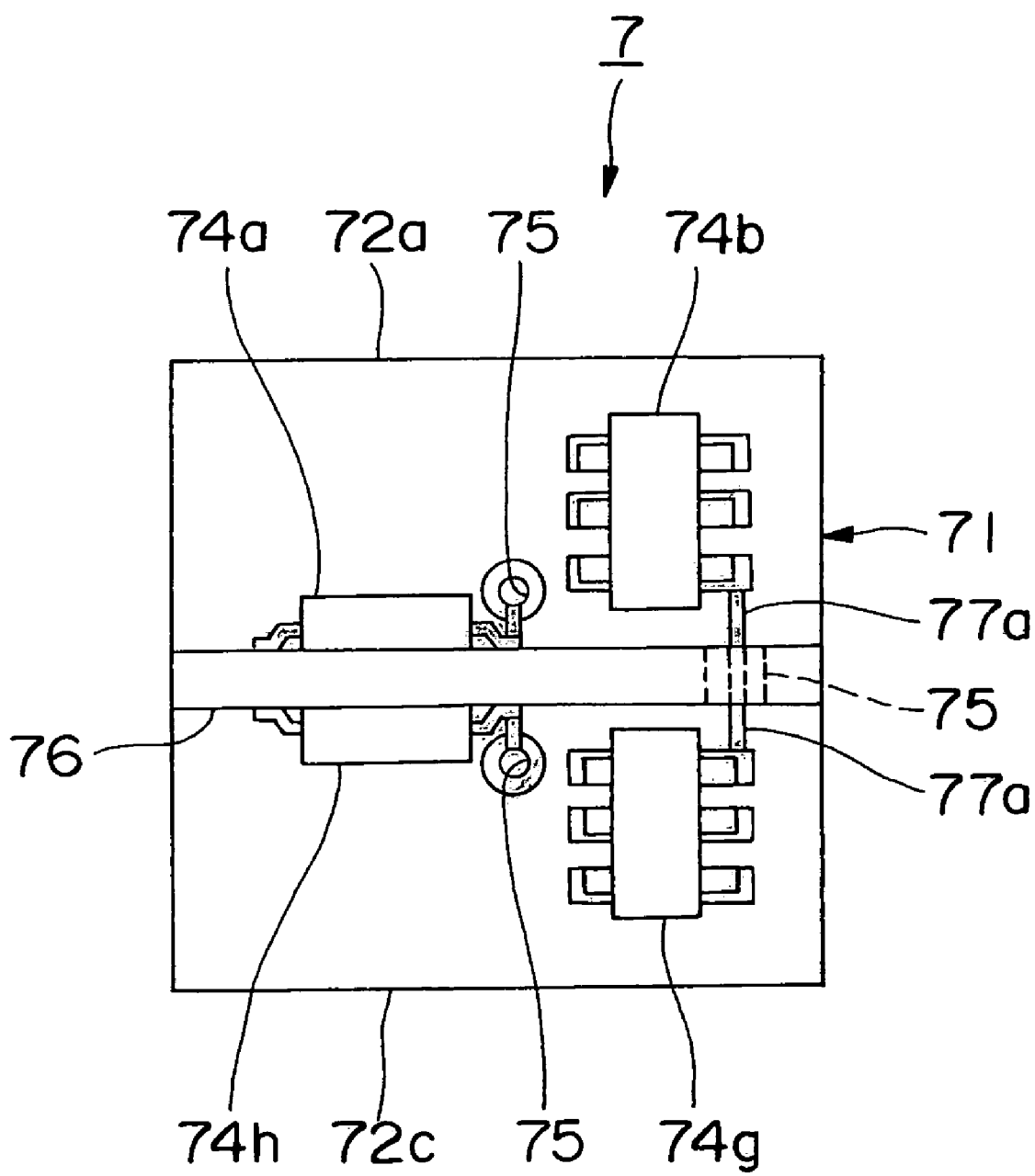
FIG. 16 is an arrow view taken along the arrow line D in FIG. 15.

These electronic components 74*b*, 74*g* are, as illustrated in FIG. 16, connected by a wire 77*a* extending via the through-hole 75 in the bilateral stacked portion 76 interposed therebetween.

Further, the electronic component 74*a* mounted on the upper surface of the bilateral stacked portion 76 in FIG. 15 is connected to the electronic component 74*d* mounted on the upper surface of the folded portion 72*b* on the opposite side.

Figure 17:
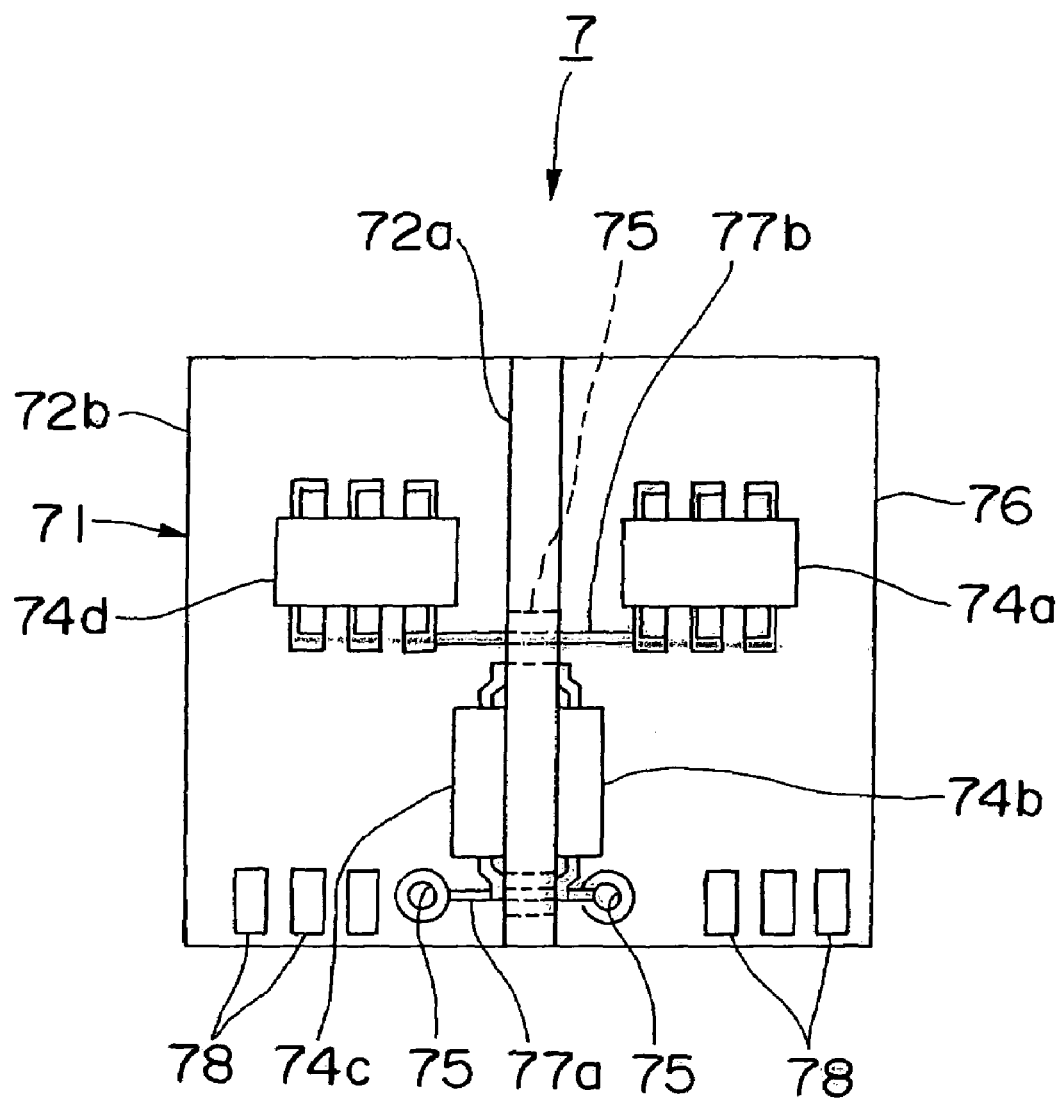
FIG. 17 is an arrow view taken along the arrow line E in FIG. 15.

These electronic components 74*a*, 74*d* are, as illustrated in FIG. 17, connected by a wire 77*b* extending via the through-hole 75 in the folded portion 72*a* interposed therebetween.

Figure 18:
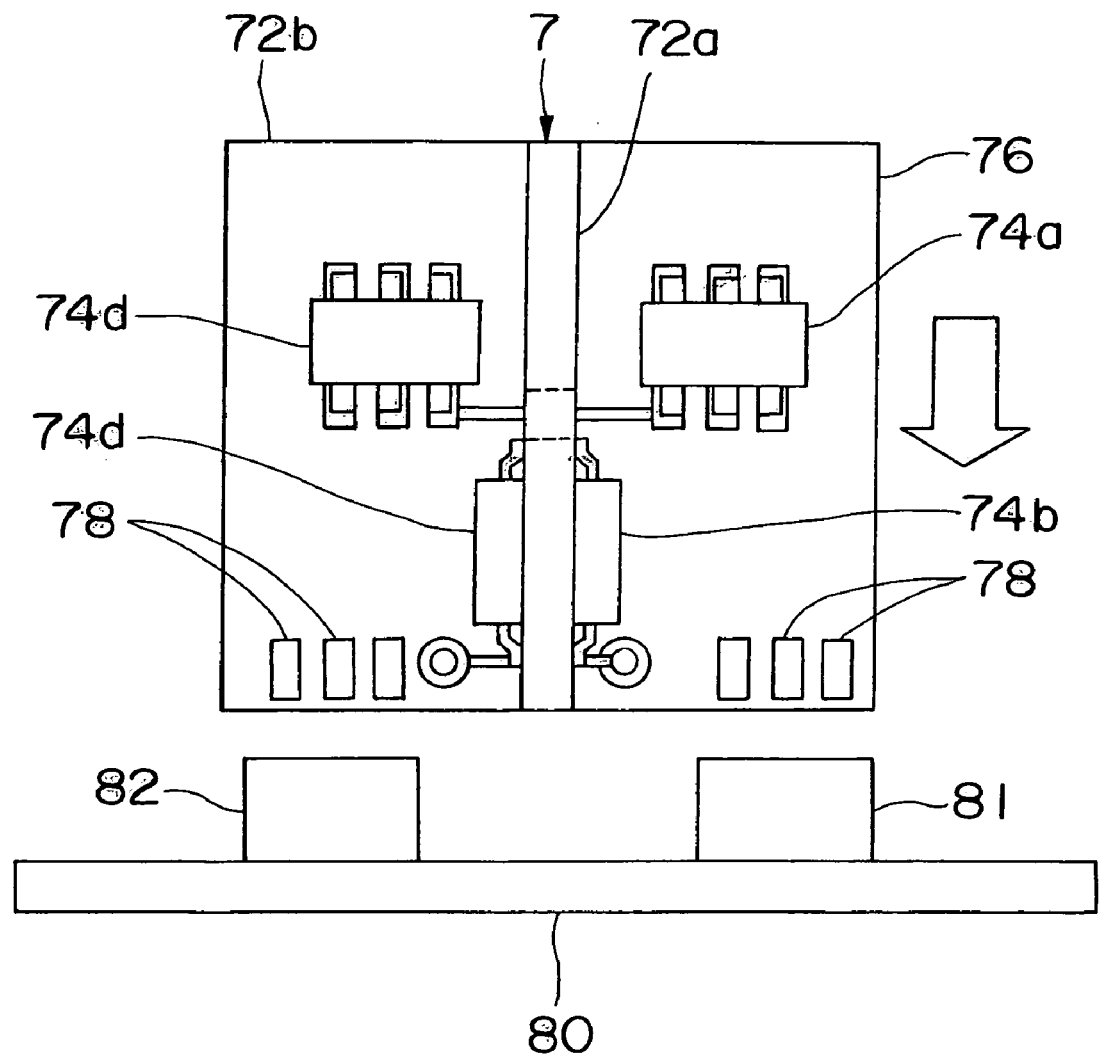
FIG. 18 is an explanatory front view showing a fifth embodiment of the present invention.

Note that in this memory module 7, as illustrated in FIG. 18, external connection terminals 78 are formed at an edge portion of the bilateral stacked portion 76 and at an edge portion of the folded portion 72*b* on the opposite side thereto. These external connection terminals 78 are, as will be explained later on, used when attaching the memory module 7 to a motherboard 80.

Fifth Embodiment

Figure 19:
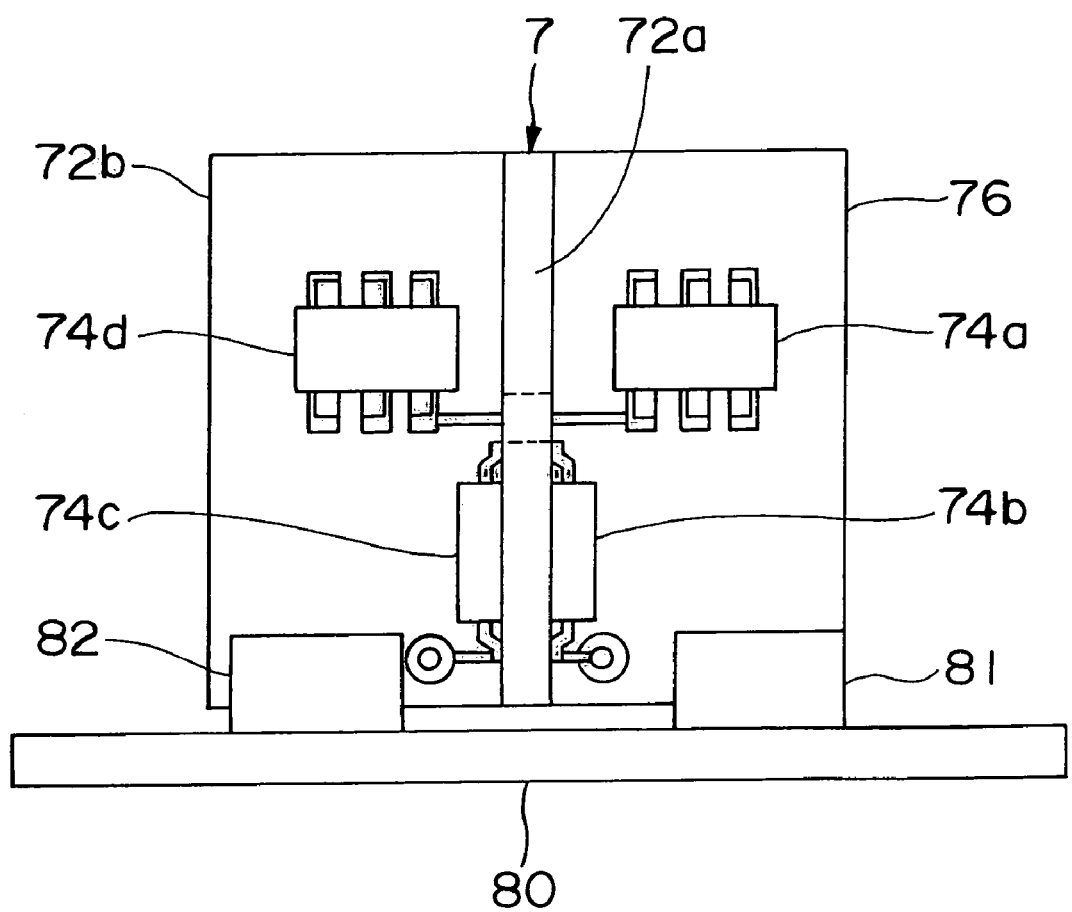
FIG. 19 is an explanatory front view showing the fifth embodiment of the present invention.

FIGS. 18 and 19 show a fifth embodiment of the present invention. A case of mounting the memory module 7 on the motherboard 80 will be described.

In this case, as shown in FIG. 18, two pieces of connectors 81, 82 are fitted at a predetermined interval to the motherboard 80. Then, the edge portions, provided with the external connection terminals 78, of the memory module 7 are inserted into the connectors 81, 82. The memory module 8 is, as illustrated in FIG. 19, thereby fixed to the motherboard 80.

Sixth Embodiment

Figure 20:
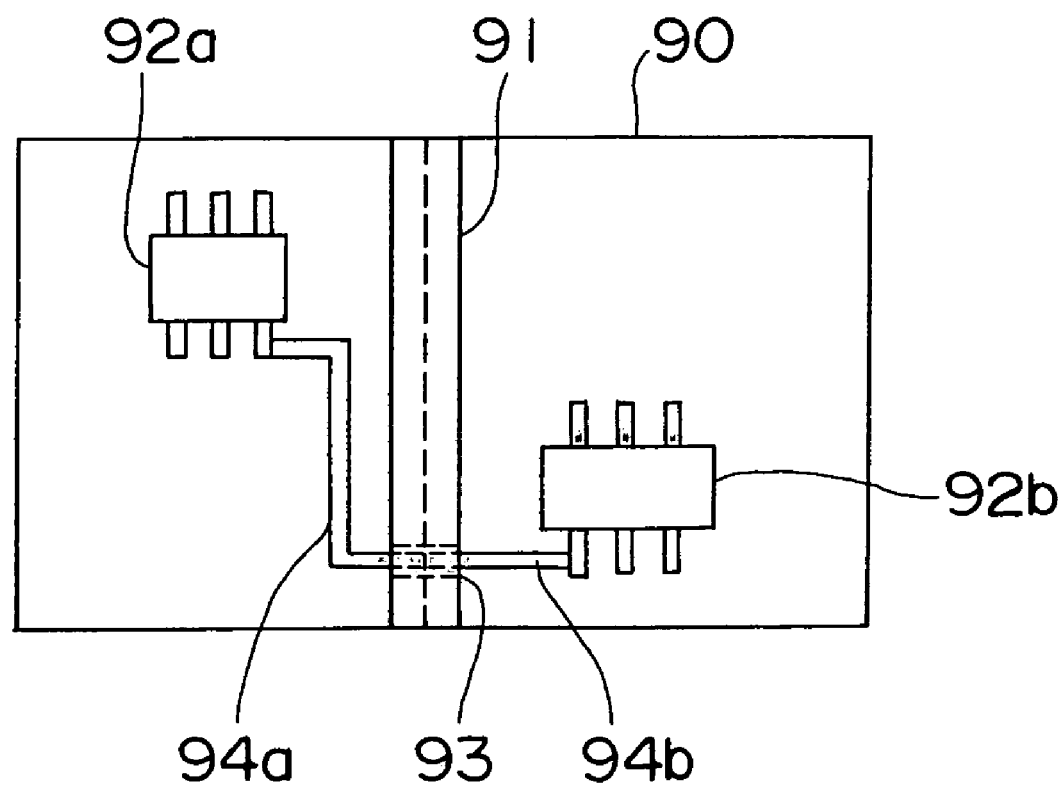
FIG. 20 is an explanatory top view showing a sixth embodiment of the present invention.
Figure 22:
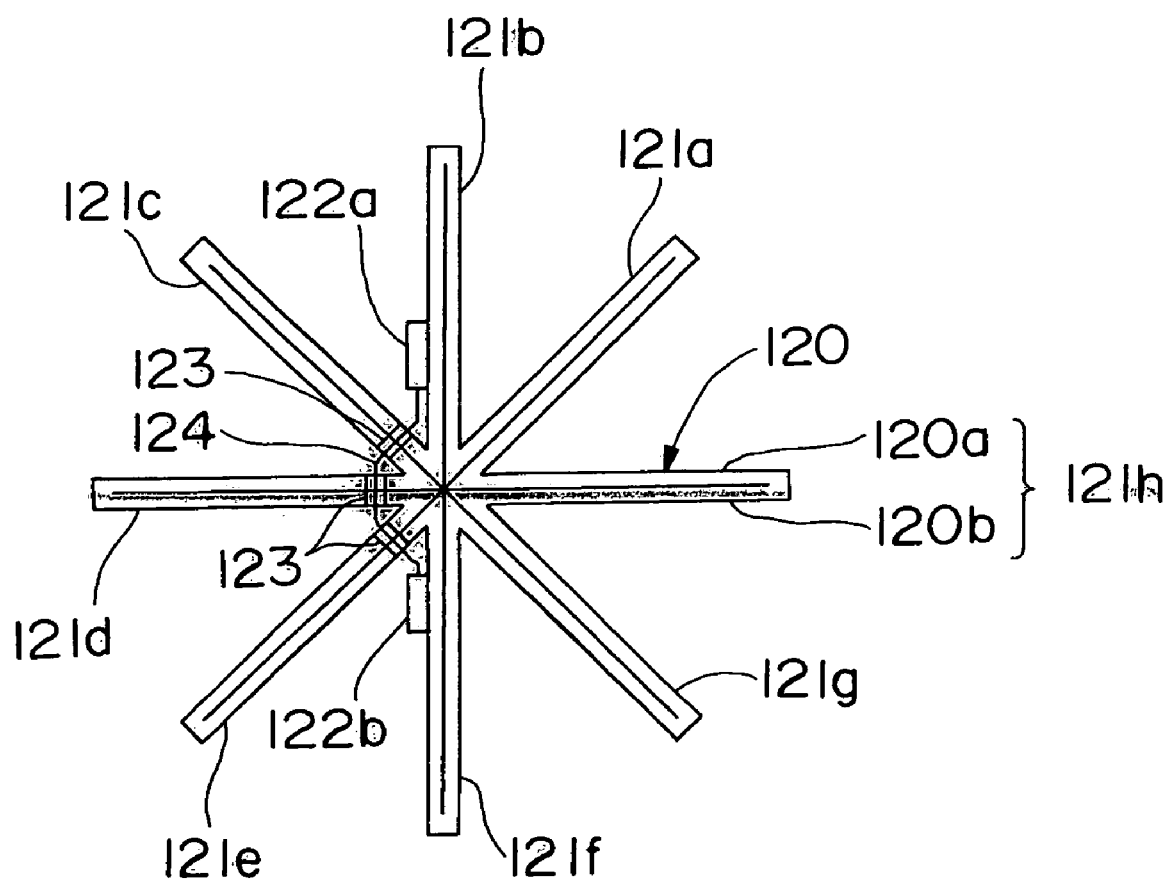
FIG. 22 is a front view showing the sixth embodiment of the present invention.

FIGS. 20 through 22 show a sixth embodiment of the present invention. In the first through fifth embodiments, the electronic components that should be connected are disposed in the symmetrical positions with respect to the folded portion. As shown in FIG. 20, however, electronic components 92*a*, 92*b* that should be connected can be disposed in asymmetrical positions with respect to a folded portion 91 formed on a printed circuit board 90.

In this case, a through-hole 93 is formed in an arbitrary position of the folded portion 91, preferably in an arbitrary position between the electronic components 92*a*, 92*b*. Then, wires 94*a*, 94*b*, which are formed on both sides of the folded portion in order to connect the electronic components 92*a*, 92*b*, are connected via the through-hole 93.

Furthermore, as shown in FIG. 21(*a*), two or more pieces, i.e., herein, three pieces of folded portions 96*a*–96*c* are formed and can be arranged side by side.

In this case, the folded portions 96*a*–96*c* are protruded substantially at a right-angled to a flat portion 97 and can be arranged side by side.

Moreover, as shown in FIG. 21(*b*), the plurality of folded portions 96*a*–96*c* can be tilted to the flat portion 97.

In the cases in FIGS. 21(*a*) and 21(*b*), the electronic components 98*a*, 98*b* are mounted in a way that interposes the two or more pieces, herein, the three pieces of folded portions 96*a*–96*c* therebetween. Further, through-holes 99 are formed in the vicinity of proximal areas of all the folded portions 96*a*–96*c* disposed between the electronic components 98*a* and 98*b*.

Then, wires 100*a*, 100*b* extending from the respective electronic components 98*a*, 98*b* up to predetermined positions on the surfaces of the folded portions 96*a*, 96*b* closest to the electronic components 98*a*, 98*b*, are formed for connecting the electronic components 98*a*, 98*b*.

Further, wires 100*c*, 100*d* are also formed between the folded portions 96*a*–96*c*. Both ends of these wires 100*c*, 100*d* are extended up to predetermined positions on the surfaces of the bilateral folded portions 96*a*–96*c*.

Next, the through-holes 99 are formed in positions brought into contact with the ends of the wires 100*c*, 100*d* formed on both surfaces of the folded portions 96a–96c in the vicinity of the proximal areas of the folded portions 96a–96c.

With this arrangement, the wires 100a–100d formed on both surfaces of the folded portions 96a–96c are connected by the through-holes 99.

Moreover, as shown in FIG. 22, a plurality of, herein, seven pieces of folded portions 121a–121g and a bilateral stacked portion 121h formed by stacking bilateral portions 120a, 120b of a printed circuit board 120, are formed on the printed circuit board 120, wherein these folded portions 121a–121g and the bilateral stacked portion 121h can be disposed in a radial configuration.

In this case, electronic components 122a, 122b mounted on the arbitrary folded portions 121a–121g or on the bilateral stacked portion 121h can be connected via through-holes 123 formed in the folded portions 121a–121g interposed therebetween or in the bilateral stacked portion 121h therebetween.

Herein, the electronic components 122a, 122b are mounted on the folded portions 121b, 121f. Further, the through-holes 123 are formed in the vicinity of proximal areas of the folded portions 120c–120e interposed between these electronic components 122a, 122b.

Then, wires 124 formed across the folded portions 121b–121f are connected via the through-holes 123 in order to connect the electronic components 122a, 122b.

Moreover, in this case, the multiplicity of electronic components can be mounted on the folded portions 121a–121g and on the bilateral stacked portion 121h, and the electronic components mounted on the arbitrary folded portions 121a–121g can be connected via the through holes 123. With this configuration, a length of the wire 124 can be shortened.

Note that the embodiments discussed above have given the discussions on the cases in which the present invention is applied to the memory modules 5, 7, however, the present invention can be applied, other than this application, to a variety of electronic circuit devices such as a driver for a liquid crystal display and so on.

INDUSTRIAL APPLICABILITY

The present invention can be applied to a variety of electronic devices such as a computer, etc.

What is claimed is:

1. A packaging structure of electronic components, comprising:
   a printed circuit board;
   a plurality of electronic components mounted on said printed circuit board;
   a folded portion formed by folding and stacking said printed circuit board between said electronic components;
   through-holes formed in both surfaces of said folded portion; and
   wires provided between said electronic components and said through-holes, and thus connecting said electronic components via said through-holes,
   wherein the folded portion is formed to project from a center of a flat surface of said printed circuit board and both surfaces of said folded portion are in close contact with one another, and
   said plurality of electronic components are disposed on both sides of the folded portion.

2. A packaging structure of electronic components according to claim 1, wherein said wires connect said electronic components mounted on other than said folded portion of said printed circuit board to said through-holes in said folded portion.

3. A packaging structure of electronic components according to claim 1, wherein said folded portion is substantially orthogonal to a surface mounted with said electronic component.

4. A packaging structure of electronic components according to claim 1, wherein said folded portion is mounted with said electronic components that should be connected.

5. A packaging structure of electronic components according to claim 1, wherein said stacked printed circuit boards configuring said folded portion are fixed to each other.

6. A packaging structure of electronic components according to claim 1, wherein land portions are formed at both ends of said through hole.

7. A packaging structure of electronic components according to claim 1, wherein two or more pieces of folded portions are formed.

8. A packaging structure of electronic components according to claim 7, wherein said two or more pieces of folded portions are arranged side by side.

9. A packaging structure of electronic components according to claim 1, wherein three pieces of folded portions are formed, and said folded portions and a portion formed by stacking both edge portions of said printed circuit board configure a cross shape in section cut by a plane orthogonal to edge lines of the folded portion and the both edge portions.

10. A packaging method of electronic components, comprising:
    discontinuously forming patterns of wires on a printed circuit board;
    forming a folded portion by folding and stacking said printed circuit board at a discontinuous portion of said patterns, the folded portion is formed to project from a center of a flat surface of the printed circuit board, and both surfaces of the folded portion are in close contact with one another;
    forming a through-hole, in said folded portion, for connecting said patterns formed on both surfaces of said folded portion;
    forming said wires by covering said patterns and an inner face of said through-hole with a conductive substance; and
    mounting said electronic components on both sides of said folded portion of said printed circuit board and connecting said electronic components to said wires.

11. A packaging structure of electronic components, comprising:
    a printed circuit board;
    a plurality of electronic components mounted on said printed circuit board;
    a folded portion formed by folding and stacking said printed circuit board, wherein the folded portion is formed to project from a center of a flat surface of said printed circuit board, and both surfaces of the folded portion are in close contact with one another;
    through-holes formed in both surfaces of said folded portion; and
    wires provided between said electronic components and said through-holes, and thus connecting said electronic components via said through-holes, wherein the entire circuit printed board is formed of a plurality of folded portions disposed radially from a central point.

12. A packaging method of electronic components, comprising:

discontinuously forming patterns of wires on a printed circuit board;

forming a folded portion by folding and stacking said printed circuit board at a discontinuous portion of said patterns, the folded portion is formed to project from a center of a flat surface of the printed circuit board, and both surfaces of the folded portion are in close contact with one another;

forming a through-hole, in said folded portion, for connecting said patterns formed on both surfaces of said folded portion;

forming said wires by covering said patterns and an inner face of said through-hole with a conductive substance; and mounting said electronic components on both sides of said folded portion of said printed circuit board and connecting said electronic components to said wires.

* * * * *